(12) United States Patent
Hong et al.

(10) Patent No.: US 12,340,835 B2
(45) Date of Patent: Jun. 24, 2025

(54) SEMICONDUCTOR MEMORY DEVICE CAPABLE OF SYNCHRONIZING CLOCK SIGNALS IN CS GEARDOWN MODE

(71) Applicant: Samsung Electronics Co., Ltd., Suwon-si (KR)

(72) Inventors: Seunghwan Hong, Suwon-si (KR); Jang-Woo Ryu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 57 days.

(21) Appl. No.: 18/297,908

(22) Filed: Apr. 10, 2023

(65) Prior Publication Data

US 2024/0135985 A1 Apr. 25, 2024
US 2024/0233808 A9 Jul. 11, 2024

(30) Foreign Application Priority Data

Oct. 20, 2022 (KR) ........................ 10-2022-0135709

(51) Int. Cl.
*G11C 11/40* (2006.01)
*G06F 1/12* (2006.01)
(Continued)

(52) U.S. Cl.
CPC ............ *G11C 11/4076* (2013.01); *G06F 1/12* (2013.01); *G11C 11/4087* (2013.01); *H03K 3/037* (2013.01); *H03K 19/20* (2013.01)

(58) Field of Classification Search
CPC ............ G11C 11/4076; G11C 11/4087; G11C 7/1066; G11C 7/1072; G11C 7/1093; G11C 8/12; G11C 8/18; G11C 7/222; G11C 11/4085; G11C 11/4094; G11C 8/06; G11C 8/10; G06F 1/12; G06F 3/0659; H03K 3/037; H03K 19/20
See application file for complete search history.

(56) References Cited

U.S. PATENT DOCUMENTS 8,665,664 B2 3/2014 Moon et al.
8,890,584 B2 11/2014 Kondo
(Continued)

FOREIGN PATENT DOCUMENTS

KR 101090330 B1 12/2011
KR 102047825 B1 11/2019

OTHER PUBLICATIONS

Extended European Search Report corresponding to European Patent Application No. 23181678.6 (8 pages) (dated Apr. 9, 2024).

*Primary Examiner* — Xiaochun L Chen
(74) *Attorney, Agent, or Firm* — Myers Bigel, P.A.

(57) ABSTRACT

A semiconductor device includes a chip select signal flip-flop configured to: latch a chip select signal in-sync with a first propagation clock signal, and output a first chip select enable signal, and latch the chip select signal in-sync with a second propagation clock signal having a phase opposite to a phase of the first propagation clock signal, and output a second chip select enable signal; and a clock control circuit configured to generate the first propagation clock signal and the second propagation clock signal based on a clock signal, and selectively output one of the first propagation clock signal and the second propagation clock signal based on an enable level of the first chip select enable signal and an enable level of the second chip select enable signal.

20 Claims, 10 Drawing Sheets

(51) Int. Cl.
  *G11C 11/4076* (2006.01)
  *G11C 11/408* (2006.01)
  *H03K 3/037* (2006.01)
  *H03K 19/20* (2006.01)

(56) References Cited

U.S. PATENT DOCUMENTS

| | | |
|---|---|---|
| 9,088,287 B2 | 7/2015 | Choi et al. |
| 9,123,406 B2 | 9/2015 | Lee et al. |
| 9,384,807 B1 | 7/2016 | Kim |
| 9,508,417 B2 | 11/2016 | Kwak |
| 10,049,708 B2 | 8/2018 | Kim |
| 2014/0253188 A1 | 9/2014 | Choi et al. |
| 2022/0019257 A1* | 1/2022 | Chambers ................. G06F 1/06 |

* cited by examiner

SEMICONDUCTOR MEMORY DEVICE CAPABLE OF SYNCHRONIZING CLOCK SIGNALS IN CS GEARDOWN MODE

CROSS-REFERENCE TO RELATED APPLICATION

This application claims priority to Korean Patent Application No. 10-2022-0135709, filed Oct. 20, 2022, the disclosure of which is incorporated herein by reference.

BACKGROUND

(1) Field

The present disclosure relates to a semiconductor memory device, and more particularly, to a semiconductor memory device capable of operating a chip select (CS) geardown mode in a 2N mode.

(2) Description of the Related Art

In order to increase a set up/hold margin of a command/address, a 2N mode may be executed to increase a holding period of the command/address from one cycle to two cycles of an external clock signal (i.e., from one clock period 1tCK to two clock periods 2tCK). However, when a holding period of a chip select (CS) signal in the 2N mode is only one clock period (1tCK) of the external clock signal, as in a 1N mode, it is difficult to increase the set-up/hold margin of the command/address. Therefore, to stabilize memory operations in the 2N mode, a CS gear down mode is introduced in which the holding period of the CS signal is also increased to 2 cycles (2tCK) of the external clock signal.

In the CS geardown mode, a semiconductor memory device may receive a command/address and a CS signal based on an internal clock signal having a frequency (for example, one-half a frequency of the external clock signal) that is lower than the frequency of the external clock signal. When the 2N mode and the CS gear down mode are enabled, the frequency of the internal clock signal is lower than that of the external clock signal, so that a pulse width of the internal clock signal may be increased, and the setup/hold margin may be increased.

SUMMARY

An example embodiment provides a semiconductor device that may implement a chip-select (CS) gear down mode.

An example embodiment provides a semiconductor device that may use an internal clock signal having a lower frequency than that of an external clock signal in a CS gear down mode.

According to an example embodiment, there is provided a semiconductor device including: a chip select signal flip-flop configured to: latch a chip select signal in-sync with a first propagation clock signal, and output a first chip select enable signal, and latch the chip select signal in-sync with a second propagation clock signal having a phase opposite to a phase of the first propagation clock signal, and output a second chip select enable signal; and a clock control circuit configured to generate the first propagation clock signal and the second propagation clock signal based on a clock signal, and selectively output one of the first propagation clock signal and the second propagation clock signal based on an enable level of the first chip select enable signal and an enable level of the second chip select enable signal.

According to an example embodiment, there is provided a memory device including: a memory cell array; an address command input circuit configured to generate a first chip selecting enable signal by latching a chip selecting signal in-sync with a first propagation clock signal, generate a second chip selecting enable signal by latching the chip selecting signal in-sync with a second propagation clock signal, and receive a command/address signal and output a command associated with the command/address signal; a clock control circuit configured to divide a clock signal to generate the first propagation clock signal and the second propagation clock signal, and selectively output the first propagation clock signal or the second propagation clock signal according to a sequential order of a rising edge of the first chip selecting enable signal and a rising edge of the second chip selecting enable signal; and a command decoder configured to generate a control signal, and control the memory cell array by decoding the command at a rising edge of the first chip selecting enable signal or a rising edge of the second chip selecting enable signal.

According to an example embodiment, there is provided a memory system including: a memory controller configured to output a command/address signal, a clock signal, a chip selecting signal and a memory device configured to: generate a first propagation clock signal and a second propagation clock signal having opposite phases, based on the clock signal, enter a gear down mode according to the command/address signal, and latch the chip selecting signal in the gear down mode according to an order of a rising edge of a first chip selecting enable signal latching the chip selecting signal in-sync with the first propagation clock signal, and a rising edge of a second chip selecting enable signal latching the chip selecting signal in-sync with the second propagation clock signal.

DETAILED DESCRIPTION OF EMBODIMENTS

Figure 1:
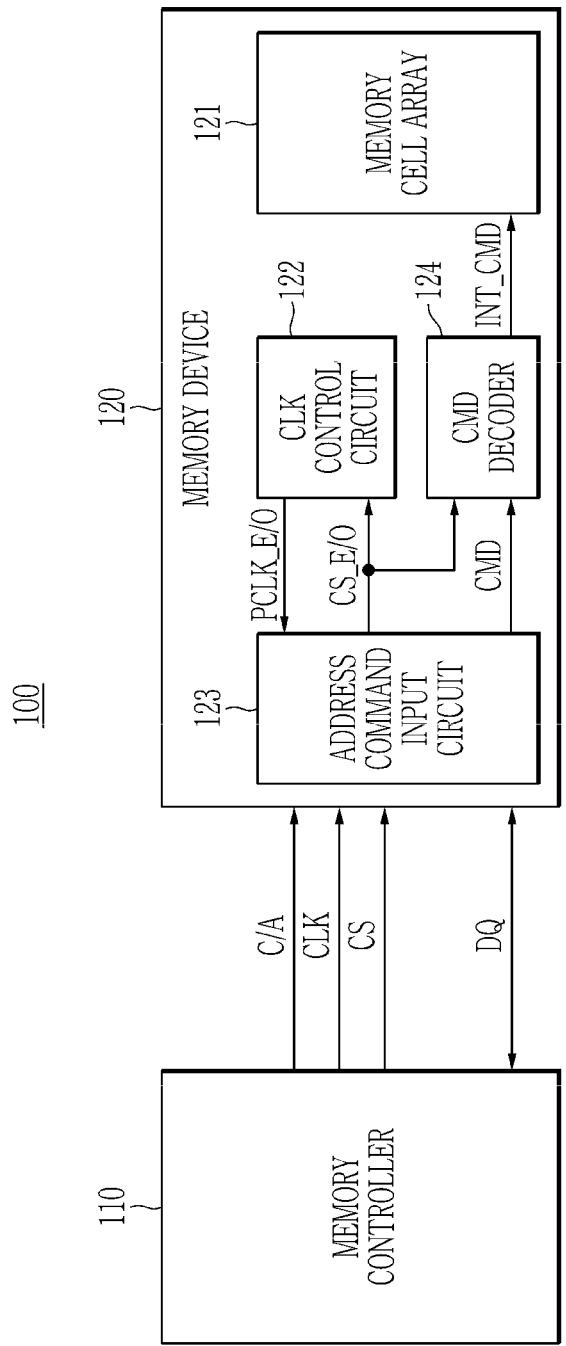
FIG. 1 illustrates a block diagram of a memory system according to an embodiment.

The present disclosure will be described more fully hereinafter with reference to the accompanying drawings, in which embodiments are shown. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification. In the flowcharts described with reference to the drawings in this specification, the operation order may be changed, various operations may be merged, certain operations may be divided, and certain operations may be omitted.

In addition, a singular form may be intended to include a plural form as well, unless the explicit expression such as "one" or "single" is used. Terms including ordinal numbers such as first, second, and the like will be used only to describe various constituent elements, and are not to be interpreted as limiting these constituent elements. These terms may be used for a purpose of distinguishing one constituent element from other constituent elements.

FIG. 1 illustrates a block diagram of a memory system according to an embodiment. Referring to FIG. 1, a memory system 100 may include a memory controller 110 and a memory device 120, which are electrically connected together. In some embodiments, the memory controller 110 and the memory device 120 may be connected via a memory interface that supports transmission of signals.

The memory controller 110 may generate a command/address signal C/A, a chip select signal CS, and a clock signal CLK. The memory controller 110 may provide the command/address signal C/A, the chip select signal CS, and the clock signal CLK to the memory device 120 via the memory interface. The memory controller 110 may receive data DQ output from the memory device 120 or transmit data DQ to the memory device 120 as an input.

The memory controller 110 may apply the clock signal CLK to the memory device 120 to control data input/output. The clock signal CLK may be provided in a form of differential signals having phases that are complementary to each other. The clock signal CLK may be a clock related to a transmission rate of the command/address signal C/A applied to perform a data input/output operation and an input/output rate of the data input/output signal DQ. The memory controller 110 may control a memory operation of the memory device 120 by providing the command/address signal C/A to the memory device 120. The command/address signal C/A may include a command CMD and an address.

In a first mode (for example, a 1N mode), a window period of the command/address signal C/A and a window period of the chip select signal CS outputted from the memory controller 110 may be one period 1tCK corresponding to one cycle of the clock signal CLK. In some embodiments, the memory controller 110 may increase and output the window period of the command/address signal C/A to two periods 2tCK of the clock signal CLK in a second mode (for example, a 2N mode). The memory controller 110 may increase the window period of the chip select signal CS to 2 periods of the clock signal CLK in a third mode (for example, a CS gear down mode). In some embodiments, the memory controller 110 may operate in the second mode or may operate in the third mode concurrently and simultaneously with the second mode. For example, the third mode (e.g., the CS geardown mode) may be enabled when the memory device 120 is operating in the second mode.

The command CMD may include an active command, a read/write command, and a refresh command. In some embodiments, the command CMD may include a precharge command. The active command may be a command for converting a target row of a memory cell array 121 to an active state in order to write data to or read data from the memory cell array 121. The memory cell of the target row may be activated (for example, driven) in response to the active command. The read/write command may be a command for performing a read or write operation on a target memory cell of a row switched to an active state. The read command may be a command for activating emphasis driving. The refresh command may be a command for performing a refresh operation on the memory cell array 121. In some embodiments, the command CMD may be a command indicating the third mode. For example, the command CMD may be a multi-purpose command (MPC) issued by a memory controller 110. The command indicating the third mode may be a command for a clock control circuit 122 to selectively output one of two propagation clock signals PCLK_O and PCLK_E.

In addition, the memory controller 110 may include various intellectual property (IP) circuits. The memory controller 110 may be referred to as an application processor (AP). In some embodiments, the memory controller 110 may access the memory device 120 according to a request from a host external to the memory system 100. The memory controller 110 can communicate with the host by using various protocols.

The memory device 120 may be a storage device based on a semiconductor device. In some embodiments, the memory device 120 may include a dynamic random access memory (DRAM) device. In some embodiments, the memory device 120 may be a static random access memory (SRAM) device, a thyristor random access memory (TRAM) device, a NAND flash memory device, a NOR flash memory device, a resistive random access memory (RRAM) device, a ferroelectric random access memory (FRAM) device, a phase change random access memory (PRAM) device, a magnetic random access memory (MRAM) device, a solid state drive (SSD), a memory card, a universal flash memory device (UFS), or the like. Hereinafter, the memory device 120 will be described as a DRAM device (that is, a synchronous dynamic random access memory (SDRAM) device) synchronized with the clock signal CLK outputted from the memory controller 110. Particularly, the memory device 120 may be a double data rate 5 (DDRS) SDRAM. The memory device 120 may be a component device other than a storage device.

The memory device 120 may include the memory cell array 121, the clock control circuit 122, an address command input circuit 123, and a command decoder 124. The memory cell array 121 includes a plurality of memory cells connected to a plurality of rows and a plurality of columns. In some embodiments, the rows may be defined by word lines, and the columns may be defined by bit lines.

The clock control circuit 122 may output the propagation clock signals PCLK_E and PCLK_O based on the clock signal CLK. In the embodiment, the clock control circuit 122 may divide and delay the clock signal CLK, and output the divided clock signals as the propagation clock signals PCLK_E and PCLK_O. For example, the clock control circuit 122 may generate the propagation clock signals PCLK_E and PCLK_O by dividing the clock signal CLK by two. Accordingly, rising edges (or falling edges) of both of the propagation clock signals PCLK_E and PCLK_O occur within 2 periods of the clock signal CLK.

The address command input circuit 123 may receive the command/address signal C/A and the chip select signal CS. The address command input circuit 123 may transmit the command CMD of the command/address signal C/A to the command decoder 124. The address command input circuit 123 may output the chip select signal CS as chip select enable signals CS_E/O in synchronization with the propagation clock signals PCLK_E and PCLK_O. For example, the address command input circuit 123 may output the chip select signal CS as a chip select enable signal CS_E in synchronization with the propagation clock signal PCLK_E, and may output the chip select signal CS as a chip select enable signal CS_O in synchronization with the propagation clock signal PCLK_O. When the chip select enable signals CS_E/O are output, it may mean that a level of the chip select enable signals CS_E/O has changed from a disable state to an enable state.

The address command input circuit 123 may output the chip select enable signal CS_E or the chip select enable signal CS_O by the rising edge (or falling edge) of each of the propagation clock signals PCLK_E and PCLK_O inputted while the chip select signal CS is maintained at the enable level (e.g., a high level or "1"). Hereinafter, it will be described that the operation is performed on the rising edge of the clock signals. In some embodiments, the rising edge of the propagation clock signal PCLK_E or the rising edge of the propagation clock signal PCLK_O may be generated within the period 1tCK in which the chip select signal CS is maintained at the enable level. Accordingly, when the rising edge of the propagation clock signal PCLK_E occurs while the chip select signal CS is maintained at the enable level, the address command input circuit 123 may output the chip select enable signal CS_E. Similarly, when the rising edge of the propagation clock signal PCLK_O occurs while the chip select signal CS is maintained at the enable level, the address command input circuit 123 may output the chip select enable signal CS_O.

In the embodiment, when the memory system 100 operates in the third mode, the address command input circuit 123 may output one of the chip select enable signals CS_E/O, and may not output of the other thereof. The address command input circuit 123 may receive only one of the propagation clock signals PCLK_E and PCLK_O, and may output only a chip select enable signal corresponding to the received one propagation clock signal. Specifically, the address command input circuit 123 may output the chip select enable signal CS_E or the chip select enable signal CS_O by the rising edge (or falling edge) of one propagation clock signal PCLK_E or PCLK_O received while the chip select signal CS is maintained at the enable level (hereinafter it will be described that the operation is performed on the rising edge of the clock signals). In the embodiment, the clock control circuit 122 may selectively output one of the propagation clock signals PCLK_E and PCLK_O when the memory system 100 operates in the third mode.

In the embodiment, the address command input circuit 123 may output the chip select enable signal CS_E and the chip select enable signal CS_O by each of the rising edges (or falling edges) of the propagation clock signals PCLK_E and PCLK_O received while the chip select signal CS is maintained at the enable level when the memory system 100 is switched to the third mode (hereinafter it will be described that the operation is performed on the rising edge of the clock signals). The chip select enable signal CS_E and the chip select enable signal CS_O may be sequentially output according to an order in which the rising edges of the propagation clock signals PCLK_E and PCLK_O occur. For example, if the rising edge of the propagation clock signal PCLK_E occurs before the rising edge of the propagation clock signal PCLK_O, the chip select enable signal CS_E may be generated and output by the address command input circuit 123. According to some embodiments, the clock control circuit 122 may selectively output of one of the propagation clock signals PCLK_E and PCLK_O based on the chip select enable signal CS_E and the chip select enable signal CS_O that are sequentially outputted. When the chip select enable signal CS_E is outputted before the chip select enable signal CS_O, the clock control circuit 122 may not output the propagation clock signal PCLK_O, which is a basis for outputting the chip select enable signal CS_O, and may output only the propagation clock signal PCLK_E. When the chip select enable signal CS_O is outputted before the chip select enable signal CS_E, the clock control circuit 122 may stop the output of the propagation clock signal PCLK_E, which is a basis for outputting the chip select enable signal CS_E, and may output only the propagation clock signal PCLK_O.

In some embodiments, the clock control circuit 122 may or may not output the propagation clock signal PCLK_O (i.e., may selectively output the propagation clock signal), based on the level of the chip select enable signal CS_O when the chip select enable signal CS_E is outputted (i.e., is switched to the enable level). The clock control circuit 122 may or may not output the propagation clock signal PCLK_E, based on the level of the chip select enable signal CS_E when the chip select enable signal CS_O is outputted (i.e., is switched to the enable level). The clock control circuit 122 may output one of the propagation clock signals PCLK_E and PCLK_O based on the chip select enable signals CS_E/O inputted from the address command input circuit 123 when the memory system 100 is switched to the third mode. For example, when the clock control circuit 122 receives the chip select enable signal CS_E before receiving the chip select enable signal CS_O, the clock control circuit 122 may stop the output of the propagation clock signal PCLK_O used to output the chip select enable signal CS_O among the propagation clock signals PCLK_E and PCLK_O. Then, the address command input circuit 123 may output the chip select enable signal CS_E based on the propagation clock signal PCLK_E, and may not generate or output the chip select enable signal CS_O based on the propagation clock signal PCLK_O that is not selected to be output from the clock control circuit 122.

The command decoder 124 generates a control signal INT_CMD by using the chip select enable signal CS_E/O and the command CMD received from the address command input circuit 123. For example, when one of the chip select enable signals CS_E/O is at an enable level (for example, a high level) when the command CMD is transmitted from the address command input circuit 123, the command decoder 124 may generate the control signal INT_CMD. When both of the chip select enable signals CS_E/O are at a disable level (for example, a low level) when the command CMD is transmitted from the address command input circuit 123, the command decoder 124 may not generate the control signal INT_CMD. Upon receiving the command CMD indicating the third mode, the command decoder 124 may output a gear down enable signal, which will be described later, as the control signal INT_CMD.

When the memory system 100 operates in the third mode and when both of the propagation clock signals PCLK_O and PCLK_E are generated, since the address command input circuit 123 outputs the chip select signal CS in synchronization with both of the propagation clock signals PCLK_O and PCLK_E, the memory device 120 cannot normally operate. According to the embodiment, when the memory system 100 is switched to the third mode, based on the level of the second chip select enable signal CS_O or CS_E when the first chip select enable signal CS_E or CS_O is outputted, whether the propagation clock signal PCLK_O or PCLK_E used to generate the second chip select enable signal CS_O or CS_E is output may be determined. Accordingly, the address command input circuit 123 may output the chip select signal CS by synchronizing it with one propagation clock signal PCLK_O or PCLK_E. In addition, when the command indicating the third mode is received, the address command input circuit 123 may selectively output one of propagation clock signals PCLK_O or PCLK_E within one period of the clock signal CLK based on the chip select signal CS.

Figure 2:
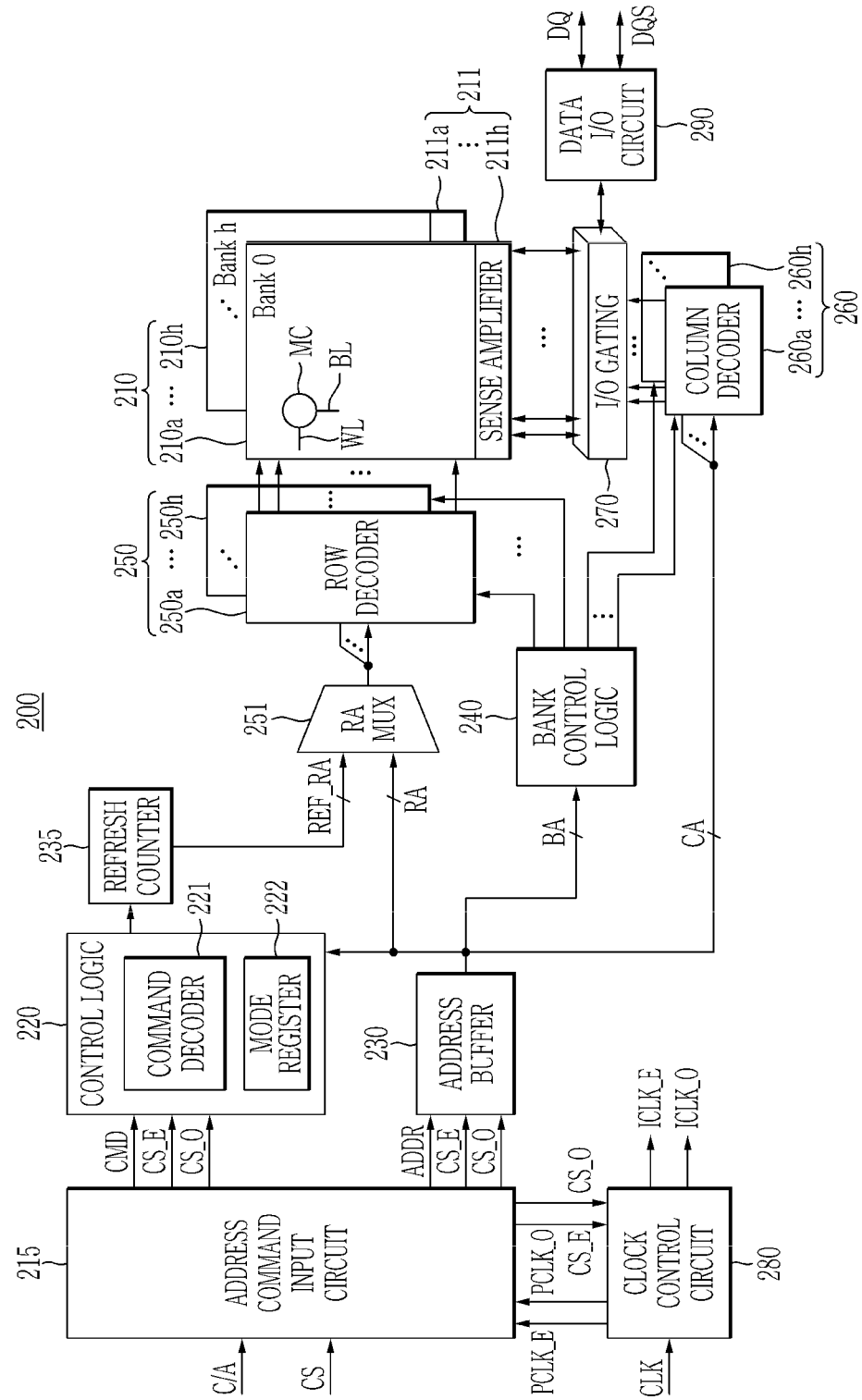
FIG. 2 illustrates a block diagram of a semiconductor memory device according to an embodiment.

FIG. 2 illustrates a block diagram of a semiconductor memory device according to an embodiment. Referring to FIG. 2, a memory device 200 illustrates a memory cell array 210, a sense amplifier 211, an address command input circuit 215, a control logic circuit 220, an address buffer 230, a row decoder 250, a column decoder 260, an I/O gating circuit 270, a clock control circuit 280, and a data I/O circuit 290. The memory cell array 210 includes a plurality of memory cells (MC). In some embodiments, the memory cell array 210 may include a plurality of memory banks 210a to 210h. Although eight memory banks (BANK0 to BANK7) 210a to 210h are illustrated in FIG. 2, the number of the memory banks is not limited thereto. Each of the memory banks 210a to 210h may include a plurality of memory cells (MC) arranged at a plurality of rows, a plurality of columns, and intersections of the plurality of rows and the plurality of columns. In some embodiments, the plurality of rows may be defined by a plurality of word lines (WL), and the plurality of columns may be defined by a plurality of bit lines (BL).

The address command input circuit 215 may receive the command/address signal C/A and the chip select signal CS. The address command input circuit 215 may provide the command CMD of the command/address signal C/A to the control logic circuit 220, and may provide an address ADDR to the address buffer 230. The address command input circuit 215 may receive the propagation clock signals PCLK_O and PCLK_E from the clock control circuit 280. In the embodiment, the address command input circuit 215 may receive one propagation clock signal PCLK_O or PCLK_E. The address command input circuit 215 may output the chip select signal CS as the chip select enable signals CS_E and CS_O in synchronization with at least one inputted propagation clock signal PCLK_O and PCLK_E.

The control logic circuit 220 controls an operation of the memory device 200. For example, the control logic circuit 220 may generate a control signal so that the memory device 200 performs a read operation, a write operation, an offset calibration operation, and the like. In some embodiments, the control logic circuit 220 may include a command decoder 221. The command decoder 221 may generate a control signal by decoding the command CMD of the command/address signal C/A received from the memory controller (for example, 110 of FIG. 1). The command decoder 221 may decode the command outputted from the address command input circuit 215, and may control internal constituent elements of the memory device 200. For example, the command decoder 221 may decode an activate command, a read command, a write command, a precharge command, a mode register write command, a multi-purpose command (MPC), and the like. All of the above-described commands may be determined in advance in the JEDEC standard. In some embodiments, the command decoder 221 may generate a control signal based on the chip select enable signals CS_E and CS_O and the command CMD. The command decoder 221 may be enabled when each of the chip select enable signals CS_E and CS_O is at an enable level, and may be disabled when each of the chip select enable signals CS_E and CS_O is at a disable level. The control logic circuit 220 may further include a mode register 222 for setting an operation mode of the memory device 200. The mode register 222 may store a code provided from the address buffer 230. The number, addresses, code sizes, and the like of the mode registers 222 may be defined in the JEDEC standard. The memory controller 110 may change values stored in the mode register 222 and may set an operating condition, an operating mode, and the like of the memory device 200, by generating a mode register write command and a code.

The address buffer 230 receives the address ADDR provided by the memory controller 110. The address ADDR includes a row address RA indicating a row of the memory cell array 210 and a column address CA indicating a column thereof. The row address RA is provided to the row decoder 250, and the column address CA is provided to the column decoder 260. In some embodiments, the row address RA may be provided to the row decoder 250 through a row address multiplexer 251. In some embodiments, the address ADDR may further include a bank address BA pointing to a memory bank. The bank address BA may be provided to a bank control logic 240. In some embodiments, the address buffer 230 may transmit the column address CA, the row address RA, and the bank address BA based on the chip select enable signals CS_E and CS_O and the address ADDR. The address buffer 230 may be enabled when the chip select enable signals CS_E and CS_O are at an enable level, and may be disabled when the chip select enable signals CS_E and CS_O are at a disable level. The address buffer 230 may provide an address received together with a mode register write command from the memory controller 110 as a code OP to the mode register 222. Since the code OP is stored in the mode register 222, it may also be referred to as an operation code OPCODE or an operand.

In some embodiments, the memory device 200 may further include the bank control logic 240 for generating a bank control signal in response to the bank address BA. The bank control logic 240 may activates a row decoder 250 corresponding to the bank address BA among a plurality of row decoders 250 and a column decoder 260 corresponding to the bank address BA among a plurality of column decoders 260, in response to the bank control signal.

In some embodiments, the memory device 200 may further include the row address multiplexer 251. The row address multiplexer 251 may receive the row address RA from the address buffer 230 and a row address REF RA to be refreshed from a refresh counter 235. The row address multiplexer 251 may selectively output the row address RA received from the address buffer 230 and the row address REF RA received from the refresh counter 235 to the row decoder 250.

The row decoder 250 selects a row to be activated from a plurality of rows of the memory cell array 210 based on the row address. To this end, the row decoder 250 may apply a driving voltage to a word line corresponding to a row to be activated. In some embodiments, a plurality of row decoders 250a to 250h corresponding to the plurality of memory banks 210a to 210h may be provided. The column decoder 260 selects a column to be activated from a plurality of columns of the memory cell array 210 based on the column address. To this end, the column decoder 260 may activate the sense amplifier 211 corresponding to the column address CA through the I/O gating circuit 270. In some embodiments, a plurality of column decoders 260a to 260h respectively corresponding to the plurality of memory banks 210a to 210h may be provided. In some embodiments, the I/O gating circuit 270 operates to gate input/output data, and may include a data latch for storing data read from the memory cell array 210 and a write driver for writing data to the memory cell array 210. Data read from the memory cell array 210 may be sensed by the sense amplifier 211 and stored in the I/O gating circuit 270 (for example, a data latch). In some embodiments, a plurality of sense amplifiers 211a to 211h respectively corresponding to the plurality of memory banks 210a to 210h may be provided. In some embodiments, data read from the memory cell array 210 (for example, data stored in the data latch) may be provided to the memory controller 110 through the data I/O circuit 290. Data to be written to the memory cell array 210 may be provided from the memory controller 110 to the data I/O circuit 290, and data provided to the data I/O circuit 290 may be provided to the I/O gating circuit 270.

In some embodiments, the data read from the memory cell array 210 (for example, the data stored in the data latch) may be provided to the memory controller 120 through the data I/O circuit 290. The data to be written to the memory cell array 210 may be provided from the memory controller 120 to the data I/O circuit 290, and the data provided to the data I/O circuit 290 may be provided to the I/O gating circuit 270. The clock control circuit 280 may receive the clock signal CLK. The clock control circuit 280 may generate internal clock signals ICLK_E and ICLK_O by dividing the frequency of the clock signal CLK. In the embodiment, the clock control circuit 280 may generate the propagation clock signals PCLK_E and PCLK_O by using the internal clock signals ICLK_E and ICLK_O. In some embodiments, the clock control circuit 280 may selectively output one of the propagation clock signals PCLK_E and PCLK_O, according to the order in which the chip select enable signals CS_E and CS_O are applied. The clock control circuit 280 may output the internal clock signals ICLK_E and ICLK_O and the propagation clock signals PCLK_E and PCLK_O.

Figure 3:
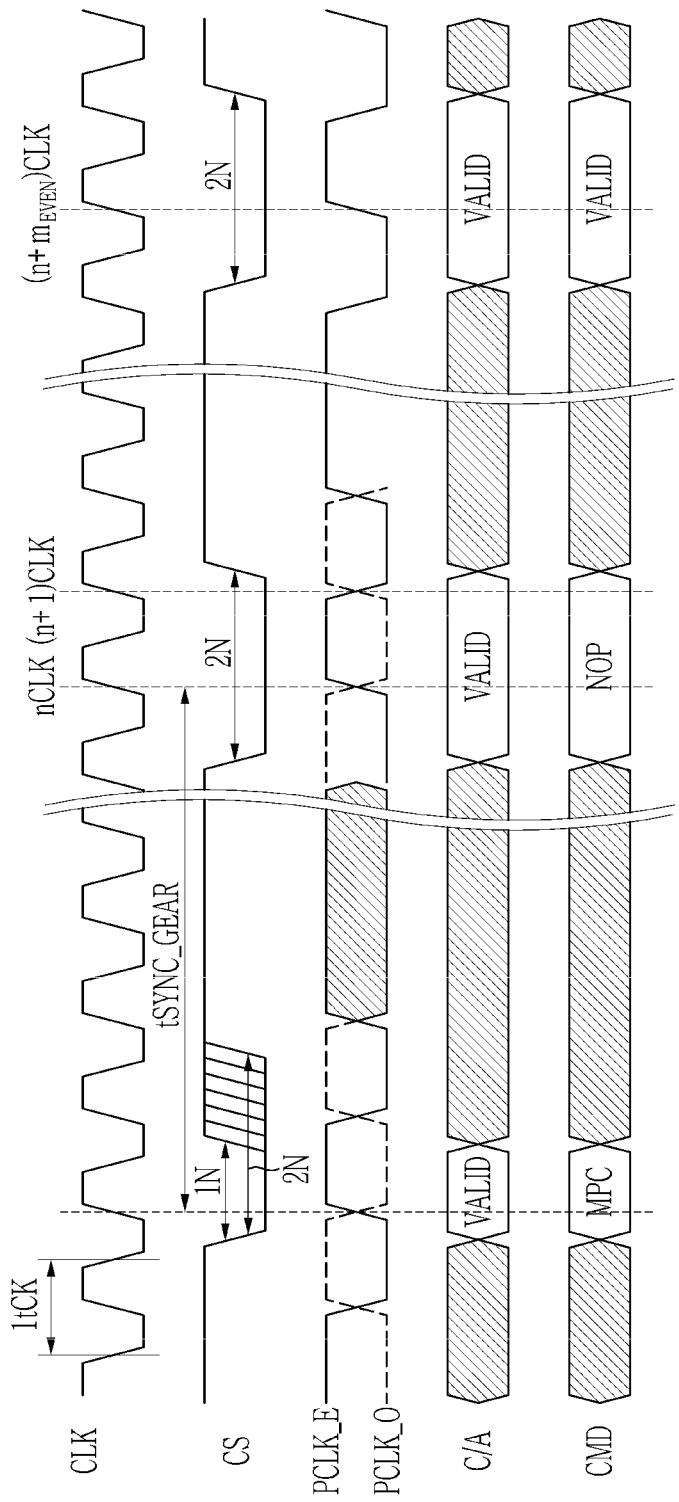
FIG. 3 illustrates a schematic timing diagram of a signal in a CS gear down mode of a semiconductor memory device according to an embodiment.

FIG. 3 illustrates a schematic timing diagram of a signal in a CS gear down mode of a semiconductor memory device according to an embodiment.

Referring to FIG. 3, the clock signal CLK may have a first frequency. The internal clock signals ICLK_E and ICLK_O may have a second frequency lower than the first frequency. For example, the second frequency may be one-half of the first frequency. In the first mode, the chip select signal CS may be at an enable level for a period 1N corresponding to one period 1tCK of the clock signal CLK. In the first mode, the command/address signal C/A may be inputted in the period 1N corresponding to one period 1tCK of the clock signal CLK. Here, the first mode may be a 1N mode.

In order to enter the third mode, the memory controller (110 of FIG. 1) may output the command/address signal C/A and a multi-purpose command MPC indicating the third mode to the memory device (120 of FIG. 1). Here, the third mode may be a CS geardown mode. For example, the CS geardown mode may be supported in the memory device 120 having a maximum data rate of 7200 Mbps or higher. The memory controller 110 may output the command/address signal C/A to the memory device 120 in synchronization with the clock signal CLK while the chip select signal CS is applied at the enable level. The chip select signal CS may have an enable level during a period 1N corresponding to one period 1tCK of the clock signal CLK or during a period 2N corresponding to two periods.

When a predetermined period tSYNC_GEAR has elapsed after receiving the multi-purpose command MPC indicating the third mode, the memory controller 110 may provide the chip select signal CS and the command/address signal C/A.

The memory controller 110 may provide the command/address signal C/A according to a predetermined rising edge nCLK (wherein n is a natural number) of the clock signal CLK. Then, a clock synchronization operation of the memory device 120 may be started. The address command input circuit (215 in FIG. 2) may synchronize the chip select signal CS maintaining the enable level for the 2N period with the propagation clock signals PCLK_E and PCLK_O to output it as the chip select enable signals CS_E and CS_O. The chip select enable signal CS_E and the chip select enable signal CS_O may be sequentially output according to an order in which the rising edges of the propagation clock signals PCLK_E and PCLK_O occur. Moreover, the clock control circuit (280 in FIG. 2) may selectively output one of the propagation clock signals PCLK_E and PCLK_O based on the chip select enable signal CS_E and the chip select enable signal CS_O that are sequentially outputted from the address command input circuit 215.

As shown in FIG. 3, the address command input circuit 215 may first output the chip select signal CS as the chip select enable signal CS_E at the rising edge nCLK of the propagation clock signal PCLK_E, and may output the chip select signal CS as the chip select enable signal CS_O at a rising edge (n+1)CLK of the propagation clock signal PCLK_O. Then, in the third mode, the clock control circuit 280 may maintain the output of the propagation clock signal PCLK_E used to generate the chip select enable signal CS_E that is first outputted, and may block the output of the propagation clock signal PCLK_O used to generate the chip select enable signal CS_O that is outputted. For example, the clock control circuit 280 may be configured to select one of the propagation clock signals PCLK_EVEN or PCLK_ODD that is first outputted. The selected one of the propagation clock signals (e.g., PCLK_E as described in an example above) may be used to generate the chip select enable signal (e.g., CS_E) by the address command input circuit 123. Alternatively or additionally, when the propagation clock signal PCLK_ODD is first outputted, the clock control circuit 280 may select the propagation clock signal PCLK_ODD, and the chip select enable signal CS_O may be generated by the address command input circuit 123.

After entering the third mode, the memory controller 110 may provide the chip select signal CS and the command/address signal C/A according to an even-numbered rising edge $(n+m_{EVEN})$CLK (wherein n is a natural number, and $m_{EVEN}$ is an even number) of the clock signal CLK. The command CMD of the command/address signal C/A may be provided to the command decoder 221. The address command input circuit 215 may output the chip select signal CS as the chip select enable signal CS_E at the rising edge of the propagation clock signal PCLK_E. In some embodiments, after entering the third mode, the memory controller 110 may operate in the second mode providing a valid (VALID) command/address signal C/A for a period of 2N. The command decoder 221 may be enabled by the chip select enable signal CS_E to decode a valid (VALID) command CMD. In the above description, although it has been described that the memory controller 110 provides the chip select signal CS and the command/address signal C/A in accordance with the even-numbered rising edge of the clock signal CLK, the memory controller 110 may provide the chip select signal CS and the command/address signal C/A in accordance with an odd-numbered rising edge of the clock signal CLK, but is not limited thereto.

Figure 4:
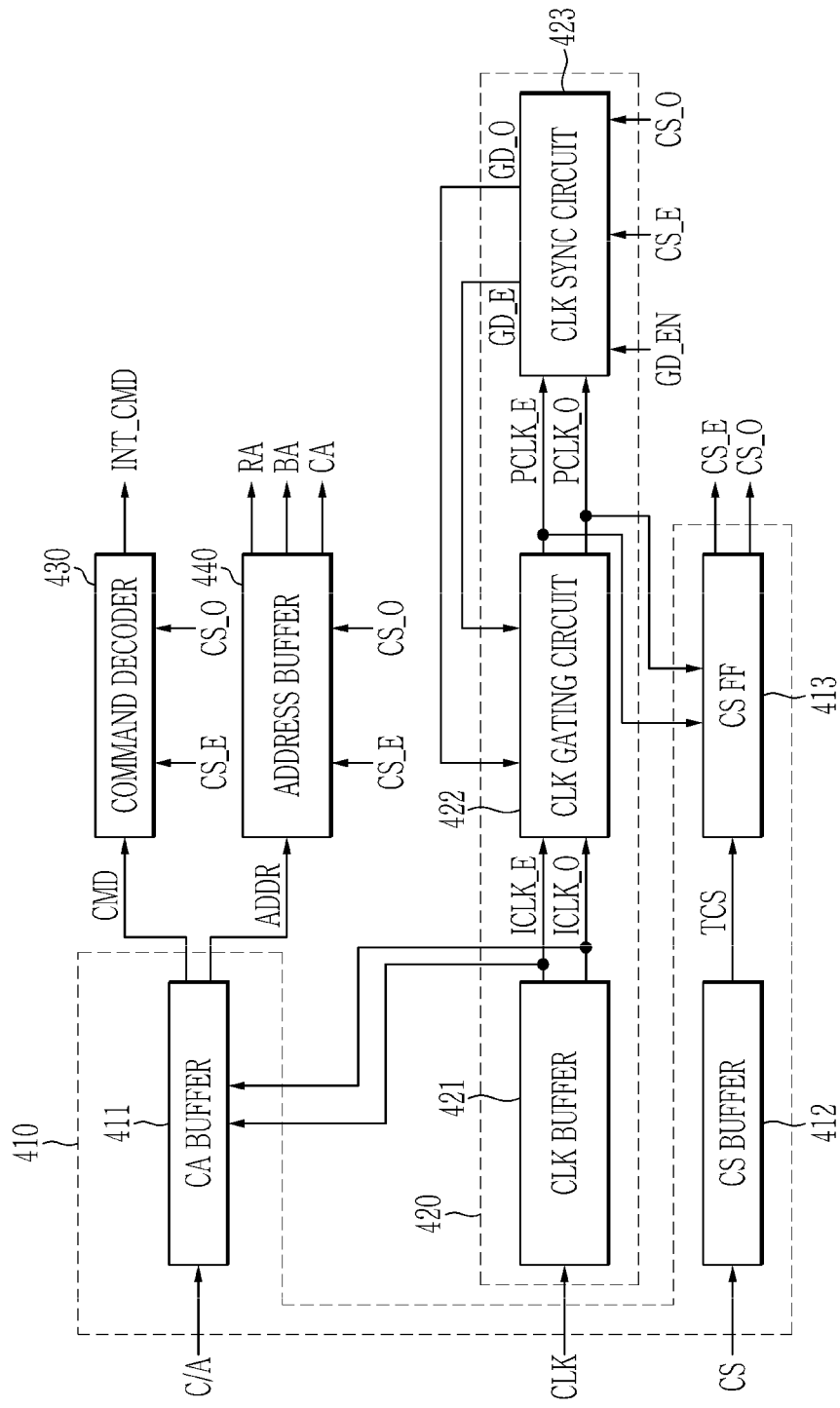
FIG. 4 illustrates a block diagram of a portion of a semiconductor memory device according to an embodiment.

FIG. 4 illustrates a block diagram of a portion of a semiconductor memory device according to an embodiment. Referring to FIG. 4, an address command input circuit 410, a clock control circuit 420, a command decoder 430, and an address buffer 440 may output the control signal INT_CMD, the column address CA, the row address RA, and the bank address BA based on the command/address signal C/A, the clock signal CLK, and the chip select signal CS. The address command input circuit 410 may output the command/address signal C/A as the command CMD and the address ADDR, and may output the chip select signal CS as the chip select enable signals CS_E and CS_O in synchronization with the propagation clock signals PCLK_E and PCLK_O. The address command input circuit 410 may include a command address buffer (CA BUFFER) 411, a CS buffer (CS BUFFER) 412, and a CS flip-flop (CS FF) 413. The CA buffer 411 may sample the command/address signal C/A based on the internal clock signals ICLK_E and ICLK_O. For example, the CA buffer 411 may sample the command/address signal C/A at the rising edge timing of the internal clock signals ICLK_E and ICLK_O to output the command CMD and the address ADDR.

The CS buffer 412 may generate an internal chip select signal TCS by buffering the chip select signal CS. The CS buffer 412 may invert and delay the chip select signal CS to generate the internal chip select signal TCS. Hereinafter, it will be described that a low level of the chip select signal CS is a disable level, and a high level of the internal chip select signal TCS is an enable level. The CS buffer 412 may output the internal chip select signal TCS to the CS flip-flop 413.

The CS flip-flop 413 may generate the chip select enable signals CS_E and CS_O synchronized with the propagation clock signals PCLK_E and PCLK_O. The CS flip-flop 413 may latch the internal chip select signal TCS in synchronization with the propagation clock signals PCLK_E and PCLK_O to generate the chip select enable signals CS_E and CS_O. The CS flip-flop 413 may output the internal chip select signal TCS as the chip select enable signal CS_E in synchronization with the propagation clock signal PCLK_E, and may output the internal chip select signal TCS as the chip select enable signal CS_O in synchronization with the propagation clock signal PCLK_O. When the rising edge of the propagation clock signal PCLK_E occurs prior to the rising edge of the propagation clock signal PCLK_O while the internal chip select signal TCS is maintained at the enable level, the CS flip-flop 413 may output the chip select enable signal CS_E. However, when the rising edge of the propagation clock signal PCLK_O occurs prior to the rising edge of the propagation clock signal PCLK_E while the internal chip select signal TCS is maintained at the enable level, the CS flip-flop 413 may output the chip select enable signal CS_O. The CS flip-flop 413 may output the chip select enable signal CS_E or the chip select enable signal CS_O to a clock synchronizing circuit 423.

The clock control circuit 420 may divide the inputted clock signal CLK to output the internal clock signals ICLK_E and ICLK_O, and may output the propagation clock signals PCLK_E and PCLK_O generated based on the internal clock signals ICLK_E and ICLK_O. In some embodiments, the clock control circuit 420 may output only one of the propagation clock signals PCLK_E and PCLK_O. The clock control circuit 420 may include a clock buffer (CLK BUFFER) 421, a clock gating circuit (CLK GATING CIRCUIT) 422, and the clock synchronizing circuit (CLK SYNC CIRCUIT) 423.

The clock buffer 421 may buffer and divide the clock signal CLK to generate the internal clock signals ICLK_E and ICLK_O. In some embodiments, the clock buffer 421 may include a half divider. The clock buffer 421 may generate the internal clock signals ICLK_E and ICLK_O synchronized every 2 periods of the clock signal CLK. The clock buffer 421 may generate the internal clock signals ICLK_E and ICLK_O synchronized with the rising edge of the clock signal CLK. The clock buffer 421 may output the internal clock signals ICLK_E and ICLK_O to the CA buffer 411 and the clock gating circuit 422.

The clock gating circuit 422 may output the propagation clock signals PCLK_E and PCLK_O based on the internal clock signals ICLK_E and ICLK_O and the gear down control signals GD_E and GD_O. The clock gating circuit 422 may or may not output the propagation clock signals PCLK_E and PCLK_O according to levels of the gear down control signals GD_E and GD_O. For example, when the gear down control signals GD_E and GD_O are all at the enable level (for example, described as being at a logic high level), the clock gating circuit 422 may buffer the internal clock signals ICLK_E and ICLK_O to output them as the propagation clock signals PCLK_E and PCLK_O. When one (for example, GD_O) of the gear down control signals GD_E and GD_O is at the disable level and the other one (GD_E) thereof is at the enable level, the clock gating circuit 422 may block the output of the internal clock signal ICLK_O gated by the gear down control signal GD_O among the internal clock signals ICLK_E and ICLK_O, and may output the output of the internal clock signal ICLK_E gated by the gear down control signal GD_E as the propagation clock signal PCLK_E.

The clock synchronizing circuit 423 may output the gear down control signals GD_E and GD_O based on the gear down enable signal GD_EN and the chip select enable signals CS_E and CS_O. The clock synchronizing circuit 423 may maintain the gear down control signals GD_E and GD_O of the enable level when the gear down enable signal GD_EN is applied at the disable level (for example, a logic low level). In the embodiment, when the gear down enable signal GD_EN is applied at the enable level, the clock synchronizing circuit 423 may use the chip select enable signals CS_E and CS_O to change and output levels of the gear down control signals GD_E and GD_O. For example, the clock synchronizing circuit 423 may change the levels of the gear down control signals GD_E and GD_O based on the level of the second chip select enable signal CS_O or CS_E when the first chip select enable signal CS_E or CS_O is outputted.

The command decoder 430 may generate the control signal INT_CMD based on the command CMD and the chip select enable signals CS_E and CS_O. The command decoder 430 may generate the control signal INT_CMD when a level of one of the chip select enable signals CS_E and CS_O is changed to the enable level while the command CMD is inputted. The command decoder 430 may provide the gear down enable signal GD_EN as the control signal INT_CMD.

The address buffer 440 may generate the column address CA, the row address RA, and the bank address BA based on the address ADDR and the chip select enable signals CS_E and CS_O. When a level of one of the chip select enable signals CS_E and CS_O is changed to the enable level while the address ADDR is inputted, the address buffer 440 may generate the column address CA, the row address RA, and the bank address BA.

Figure 5:
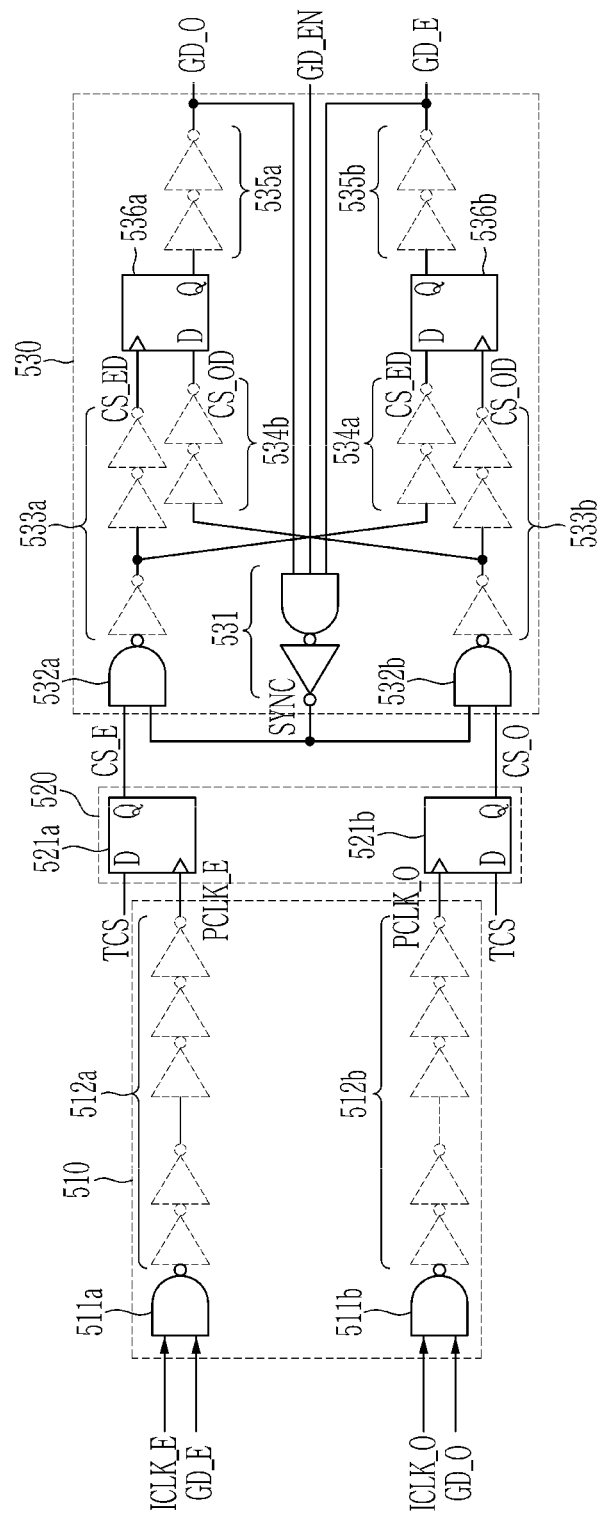
FIG. 5 illustrates a logic circuit diagram, which includes a clock gating circuit, a chip select signal flip-flop, and a clock synchronization circuit, according to an embodiment.

FIG. 5 illustrates a logic circuit diagram including a clock gating circuit, a chip select signal flip-flop, and a clock synchronization circuit according to an embodiment. Referring to FIG. 5, a clock gating circuit 510 may output the propagation clock signals PCLK_E and PCLK_O based on the internal clock signals ICLK_E and ICLK_O and the gear down control signals GD_E and GD_O. The clock gating circuit 510 may include clock selectors 511a and 511b and clock delay parts 512a and 512b.

The clock selectors 511a and 511b may receive one of the internal clock signals ICLK_E and ICLK_O, and one of the gear down control signals GD_E and GD_O corresponding to one of the internal clock signals ICLK_E and ICLK_O. When the gear down control signal GD_E or GD_O is at the disable level, the clock selector 511a or 511b may output a signal of the disable level. When the gear down control signal GD_E or GD_O is at the enable level, the clock selector 511a or 511b may output a signal toggled according to the internal clock signal ICLK_E or ICLK_O. In some embodiments, the clock selector 511a may be a two-input negative-AND (NAND) gate circuit that performs a NAND operation on the internal clock signal ICLK_E and the gear down control signal GD_E. The clock selector 511b may be a two-input NAND gate circuit that performs a NAND operation on the internal clock signal ICLK_O and the gear down control signal GD_O.

The clock delay parts 512a and 512b may delay clock signals outputted from the clock selectors 511a and 511b and output the delayed clock signals as the propagation clock signals PCLK_E and PCLK_O. Each of the clock delay parts 512a and 512b may include one or more inverters acting as a buffer. The CS flip-flop 520 may generate the chip select enable signals CS_E and CS_O synchronized with the propagation clock signals PCLK_E and PCLK_O. The CS flip-flop 520 may include flip-flops 521a and 521b that latch the internal chip select signal TCS in synchronization with the propagation clock signals PCLK_E and PCLK_O to output it as the chip select enable signals CS_E and CS_O. The propagation clock signals PCLK_E and PCLK_O may be inputted to clock input terminals of the flip-flops 521a and 521b, and the internal chip select signal TCS may be inputted to input terminals of the flip-flop 521a and 521b.

The clock synchronizing circuit 530 may output the gear down control signals GD_E and GD_O based on the gear down enable signal GD_EN and the chip select enable signals CS_E and CS_O. A clock synchronizing circuit 530 may include a synchronization signal generator 531, chip select signal gating parts 532a and 532b, signal delaying parts 533a and 533b, 534a and 534b, and 535a and 535b, and flip-flops 536a and 536b. Here, the delaying parts 533a, 533b, 534a, 534b, 535a and 535b may each include one or more inverters acting as a buffer.

The synchronization signal generator 531 may receive the gear down enable signal GD_EN and the gear down control signals GD_E and GD_O, and may output a synchronization signal SYNC. The synchronization signal generator 531 may output the synchronization signal SYNC of the disable level when the gear down enable signal GD_EN is at the disable level. When the gear down enable signal GD_EN is at the enable level and the gear down control signals GD_E and GD_O are at the enable level, the synchronization signal generator 531 may output the synchronization signal SYNC of the enable level. In some embodiments, the synchronization signal generator 531 may include a 3-input NAND gate circuit that perform a NAND-type operation on the gear down enable signal GD_EN and the gear down control signals GD_E and GD_O, and an inverter connected to an output terminal of the 3-input NAND gate circuit (to convert the NAND-type operation to an AND-type operation).

The chip select signal gating parts 532a and 532b may receive the chip select enable signals CS_E and CS_O and the synchronization signal SYNC. When the synchronization signal SYNC is at the disable level, the chip select signal gating parts 532a and 532b may output a signal of the enable level regardless of the levels of the chip select enable signals CS_E and CS_O. When the synchronization signal SYNC is at the enable level, the chip select signal gating parts 532a and 532b may output signals corresponding to the levels of the chip select enable signals CS_E and CS_O. In some embodiments, the chip select signal gating part 532a may be a 2-input NAND gate circuit that performs a NAND operation on the chip select enable signal CS_E and the synchronization signal SYNC. The chip select signal gating part 532b may be a 2-input NAND gate circuit that performs a NAND operation on the chip select enable signal CS_O and the synchronization signal SYNC.

The output signals of the chip select signal gating parts 532a and 532b may be delayed through the signal delaying parts 533a and 533b to be inputted to clock input terminals of the flip-flops 536a and 536b as the delayed chip select enable signals CS_ED and CS_OD. The output signals of the chip select signal gating parts 532a and 532b may be delayed through the signal delaying parts 534a and 534b to be inputted to input terminals of the flip-flops 536b and 536a respectively, as the delayed chip select enable signals CS_ED and CS_OD.

When the delayed chip select enable signal CS_ED transitions from the disable level to the enable level (that is, at a rising edge), the flip-flop 536a may output a signal corresponding to the level of the delayed chip select enable signal CS_OD. For example, when the chip select enable signal CS_E transitions to the enable level before the chip select enable signal CS_O transitions to the enable level, the flip-flop 536a may output a signal of the disable level. When the delayed chip select enable signal CS_OD transitions from the disable level to the enable level, the flip-flop 536b may output a signal corresponding to the level of the delayed chip select enable signal CS_ED. When the chip select signal gating parts 532a and 532b maintain the output of the signal of the enable level when the synchronization signal SYNC is at the disable level, the flip-flops 536a and 536b may maintain the previous output. The output signals of the flip-flops 536b and 536a may be delayed through the signal delaying parts 535a and 535b to be outputted as the gear down control signals GD_E and GD_O.

Figure 6:
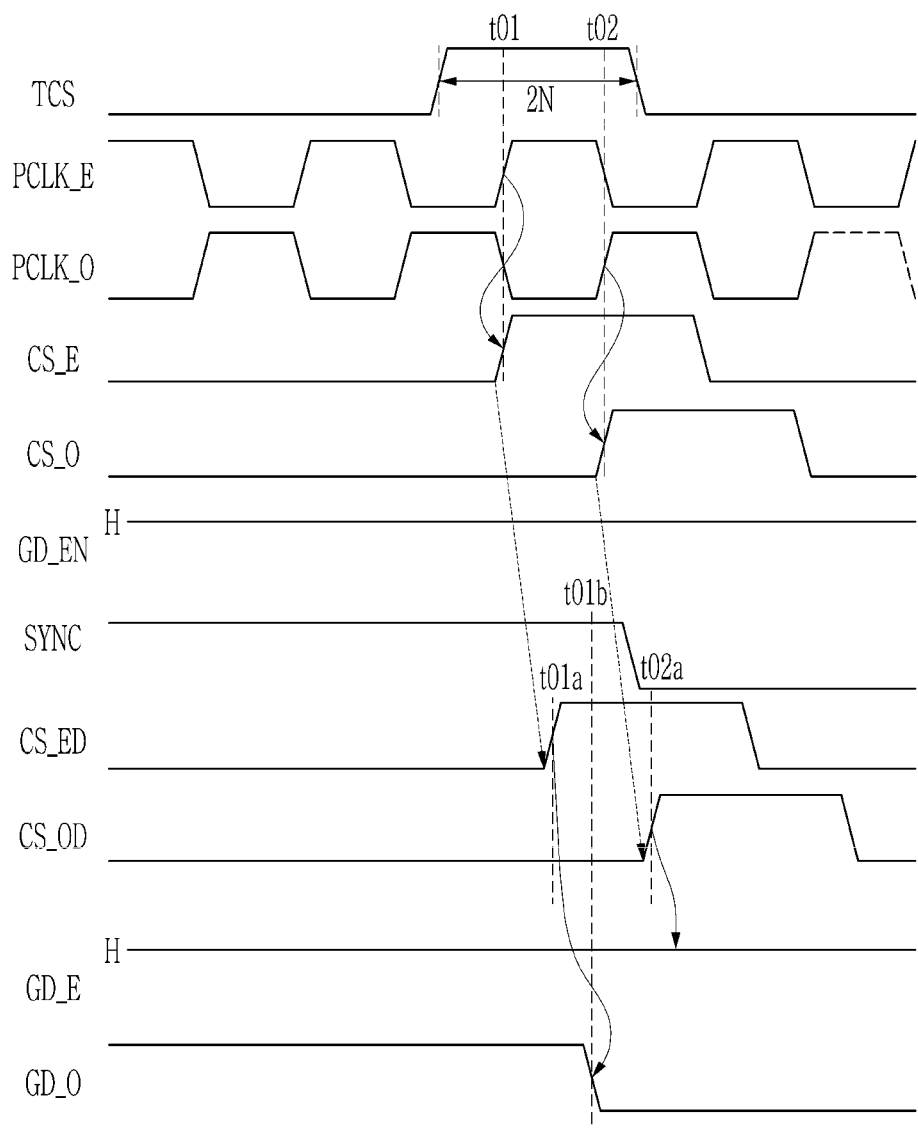
FIGS. 6 through 8 illustrate timing diagrams of input and output signals of a clock gating circuit, a chip select signal buffer, and a clock synchronization circuit.

Hereinafter, input/output signals of the circuits described with reference to FIG. 5 will be described with reference to FIG. 6 to FIG. 8, which illustrate timing diagrams of input and output signals of a clock gating circuit, a chip select signal buffer, and a clock synchronization circuit. Referring to FIG. 6, the internal chip select signal TCS may be maintained at an enable level for a period of 2N. While the internal chip select signal TCS is maintained at the enable level, the rising edge of the propagation clock signal PCLK_E may occur at a time point t01, and the rising edge of the propagation clock signal PCLK_O may occur at a time point t02. At the time point t01, the flip-flop 521a may output the chip select enable signal CS_E at the enable level. At the time point t01, all of the gear down control signals GD_E and GD_O and the synchronization signal SYNC may be at an enable level (H). A rising edge of the delayed chip select enable signal CS_ED may occur at a time point t01a. At the time point t01a, the flip-flop 536a may output a signal corresponding to the level of the delayed chip select enable signal CS_OD, that is, the disable level. The signal outputted from the flip-flop 536a may be delayed through the signal delay part 535a to be outputted as the gear down control signal GD_O. The gear down control signal GD_O may transition to the disable level at a time point t01b. By the gear down control signal GD_O of the disable level, the synchronization signal SYNC may transition to the disable level after the time point t01b.

At the time point t02, the flip-flop 521b may output the chip select enable signal CS_O at the enable level. A rising edge of the delayed chip select enable signal CS_OD may occur at a time point t02a. At the time point t02a, the flip-flop 536b may output a signal corresponding to the level of the delayed chip select enable signal CS_ED, that is, the enable level. The signal outputted from the flip-flop 536b may be delayed through the signal delay part 535b to be outputted as the gear down control signal GD_E.

Accordingly, the clock synchronizing circuit 530 may output the gear down control signal GD_E of the enable level, which controls outputting of the propagation clock signal PCLK_E first having a rising edge, while the internal chip select signal TCS is at the enable level, and may output the gear down control signal GD_O of the disable level, which controls outputting of the propagation clock signal PCLK_O. The clock gating circuit 510 may receive the gear down control signal GD_E of the enable level, and may output the propagation clock signal PCLK_E toggled according to the internal clock signal ICLK_E. The clock gating circuit 510 may receive the gear down control signal GD_O of the disable level, and may output the propagation clock signal PCLK_O of the disable level.

In the above description, it has been assumed and described that the synchronization signal SYNC transitions to the disable level after the time point t02, but the synchronization signal SYNC may transition to the disable level between the time point t01b and the time point t02. In this case, the delayed chip select enable signal CS_OD at the time point t02 may be maintained at the disabled level.

Figure 7:
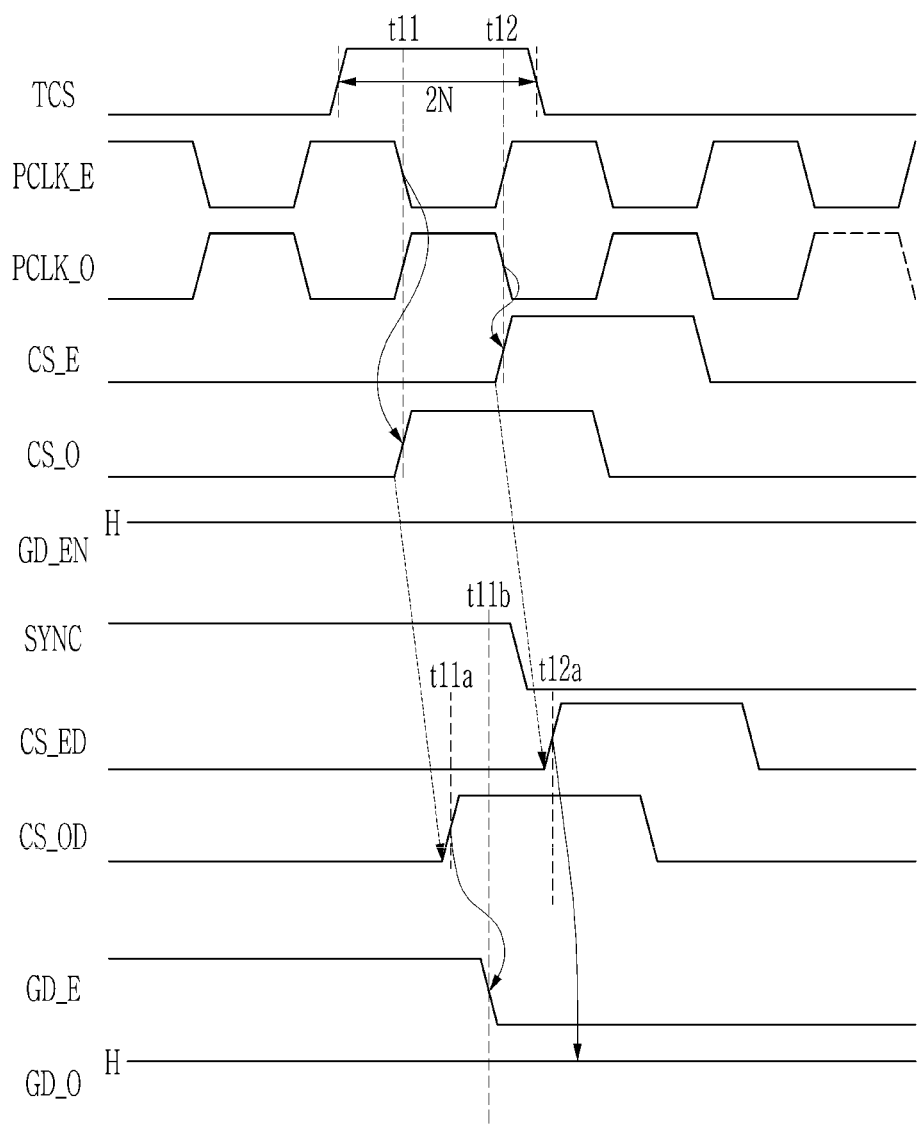

Referring to FIG. 7, while the internal chip select signal TCS is maintained at the enable level, the rising edge of the propagation clock signal PCLK_O may occur at a time point t11, and the rising edge of the propagation clock signal PCLK_E may occur at a time point t12. At the time point t11, the flip-flop 521b may output the chip select enable signal CS_O at the enable level. A rising edge of the delayed chip select enable signal CS_OD may occur at a time point t11a. At the time point t11a, the flip-flop 536b may output a signal corresponding to the level of the delayed chip select enable signal CS_ED, that is, the disable level. The signal outputted from the flip-flop 536b may be delayed through the signal delay part 535b to be outputted as the gear down control signal GD_E. The gear down control signal GD_E may transition to the disable level at a time point t11b. By the gear down control signal GD_E of the disable level, the synchronization signal SYNC may transition to the disable level after the time point t11b.

At the time point t12, the flip-flop 521a may output the chip select enable signal CS_E at the enable level. A rising edge of the delayed chip select enable signal CS_ED may occur at a time point t12a. At the time point t12a, the flip-flop 536a may output a signal corresponding to the level of the delayed chip select enable signal CS_OD, that is, the enable level. The signal outputted from the flip-flop 536a may be delayed through the signal delay part 535a to be outputted as the gear down control signal GD_O.

Accordingly, the clock synchronizing circuit 530 may output the gear down control signal GD_O of the enable level, which controls to output the propagation clock signal PCLK_O first having a rising edge, while the internal chip select signal TCS is at the enable level, and may output the gear down control signal GD_E at the disable level, which controls outputting of the propagation clock signal PCLK_E. The clock gating circuit 510 may receive the gear down control signal GD_O of the enable level, and may output the propagation clock signal PCLK_O toggled according to the internal clock signal ICLK_O. The clock gating circuit 510 may receive the gear down control signal GD_E of the disable level, and may output the propagation clock signal PCLK_E of the disable level.

In the above description, it has been assumed and described that the synchronization signal SYNC transitions to the disable level after the time point t12, but the synchronization signal SYNC may transition to the disable level between the time point t11b and the time point t12. In this case, the delayed chip select enable signal CS_ED at the time point t12 may be maintained at the disabled level.

Figure 8:
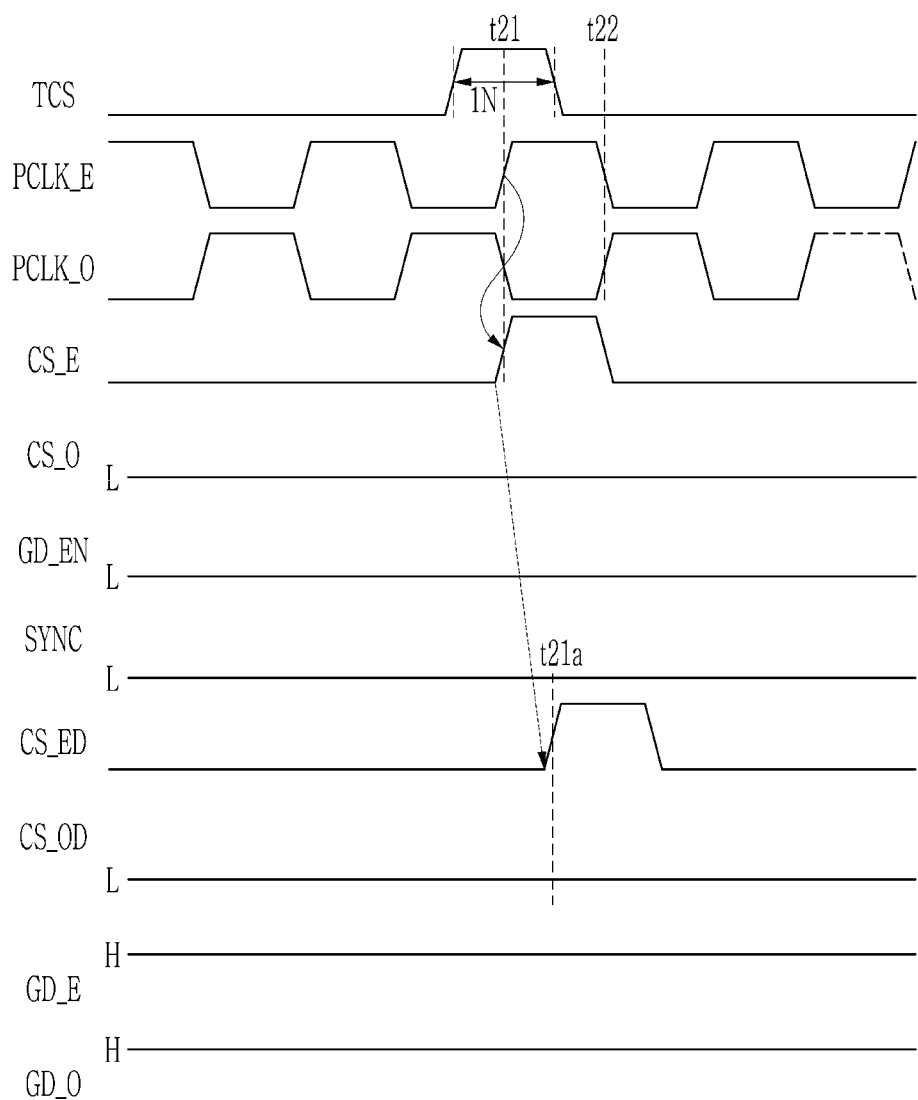

Referring to FIG. 8, the internal chip select signal TCS may be maintained at an enable level for a period of 1N. While the internal chip select signal TCS is maintained at the enable level, the rising edge of the propagation clock signal PCLK_E may occur at a time point t21. The rising edge of the propagation clock signal PCLK_O may occur at a time point t22 when the internal chip select signal TCS is at the disable level. At the time point t21, the flip-flop 521a may output the chip select enable signal CS_E at the enable level. At the time point t21, both of the gear down control signals GD_E and GD_O may be at the enable level (H), and the synchronization signal SYNC may be at the disable level (L). The rising edge of the delayed chip select enable signal CS_ED may occur at a time point t21a. Since the synchronization signal SYNC is at the disable level, the clock synchronizing circuit 530 may maintain the output of the gear down control signals GD_E and GD_O of the enable level. Accordingly, the clock gating circuit 510 may receive the gear down control signal GD_E of the enable level, and may output the propagation clock signal PCLK_E toggled according to the internal clock signal ICLK_E. The clock gating circuit 510 may receive the gear down control signal GD_O of the enable level, and may output the propagation clock signal PCLK_O toggled according to the internal clock signal ICLK_O.

Figure 9:
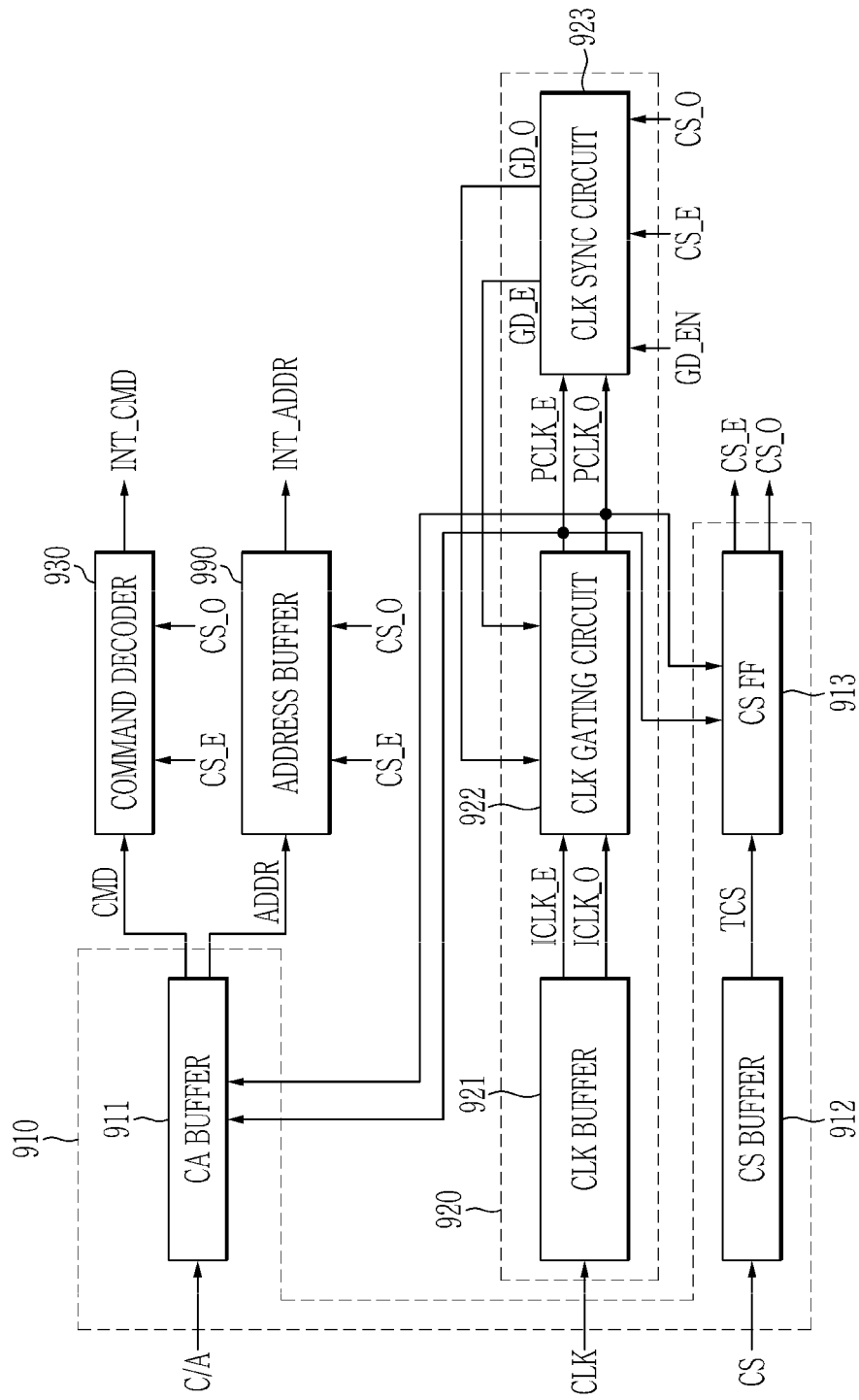
FIG. 9 illustrates a block diagram of a portion of a semiconductor memory device according to an embodiment.

FIG. 9 illustrates a block diagram of a portion of a semiconductor memory device according to an embodiment. Referring to FIG. 9, an address command input circuit 910, a clock control circuit 920, a command decoder 930, and an address buffer 940 may output the control signal INT_CMD, the column address CA, the row address RA, and the bank address BA based on the command/address signal C/A, the clock signal CLK, and the chip select signal CS. Among constituent elements shown in FIG. 9, descriptions of constituent elements that are the same as or similar to the constituent elements described in FIG. 4 will be omitted.

The address command input circuit 910 may include a CA buffer (CA BUFFER) 911, a CS buffer (CS BUFFER) 912, and a CS flip-flop (CS FF) 913. The CA buffer 911 may sample the command/address signal C/A based on the propagation clock signals PCLK_E and PCLK_O. For example, the CA buffer 911 may sample the command/address signal C/A at the rising edge timing of the propagation clock signals PCLK_E and PCLK_O to output the command CMD and the address ADDR.

Figure 10:
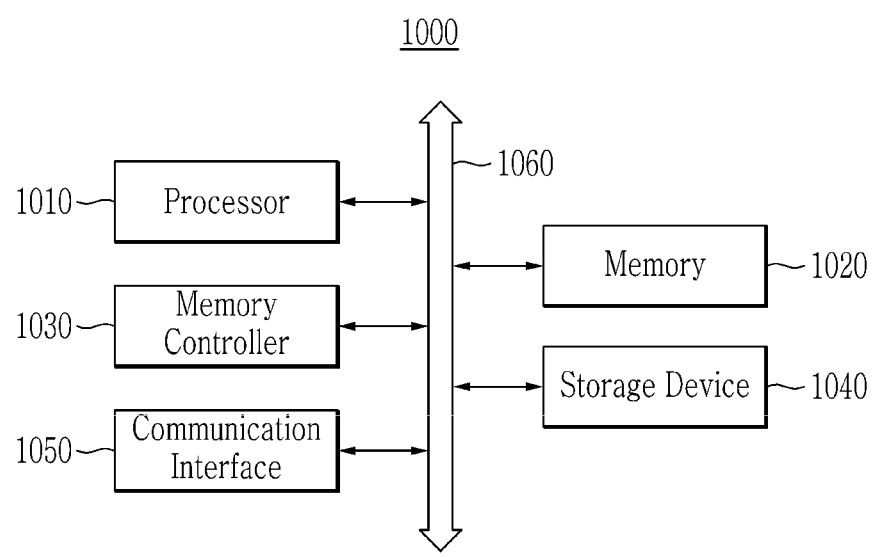
FIG. 10 illustrates a block diagram of a computer system according to an embodiment.

FIG. 10 illustrates a block diagram of a computer system according to an embodiment. This computer system 1000 includes a processor 1010, a memory 1020, a memory controller 1030, a storage device 1040, a communication interface 1050, and a bus 1060. The memory system 1000 may further include other general-purpose constituent elements. The processor 1010 controls an overall operation of each constituent element of the memory system 1000. The processor 1010 may be implemented as at least one of various processing units such as a central processing unit (CPU), an application processor (AP), and a graphic processing unit (GPU).

The memory 1020 stores various data and commands. The memory 1020 may be implemented as the memory device described with reference to FIG. 1 to FIG. 9. The memory controller 1030 controls transmission of data or commands to and from the memory 1020. The processor 1010 and the memory controller 1030 may be implemented as the memory controller described with reference to FIG. 1 to FIG. 9. In some embodiments, the memory controller 1030 may be provided as an internal configuration of the processor 1010. In some embodiments, the memory controller 1030 may be provided as a separate chip from the processor 1010.

The memory controller 1030 may output a command indicating the third mode to the memory 1020, and the memory 1020 may receive the command indicating the third mode to be switched to the third mode. By using the chip select enable signal CS_E or CS_O generated by the propagation clock signal PCLK_E or PCLK_O that first transitions while the chip select signal CS inputted from the memory controller 1030 is at the enable level when being switched to the third mode, only the propagation clock signal PCLK_E or PCLK_O that first transitions while the chip select signal CS is at the enable level may be outputted.

The storage device 1040 non-temporarily stores programs and data. In some embodiments, the storage device 1040 may be implemented as a non-volatile memory. The communication interface 1050 supports wired and wireless Internet communication of the memory system 1000. In addition, the communication interface 1050 may support various communication methods other than internet communication. The bus 1060 provides a communication function between constituent elements of the memory system 1000. The bus 1060 may include at least one type of bus according to a communication protocol between the constituent elements.

In some embodiments, each constituent element or a combination of two or more constituent elements described with reference to FIG. 1 to FIG. 9 may be implemented as a digital circuit, a programmable or non-programmable logic device or array, an application specific integrated circuit (ASIC), or the like.

While the present disclosure has been described in connection with what is presently considered to be practical embodiments, it is to be understood that the present disclosure is not limited to the disclosed embodiments, but, on the contrary, is intended to cover various modifications and equivalent arrangements included within the spirit and scope of the appended claims.

What is claimed is:

1. A semiconductor device, comprising:
a chip selecting signal flip-flop configured to:
latch a chip selecting signal in-sync with a first propagation clock signal, and output a first chip selecting enable signal, and
latch the chip selecting signal in-sync with a second propagation clock signal having a phase opposite to a phase of the first propagation clock signal, and output a second chip selecting enable signal;
wherein during a period which the chip selecting signal maintains an enable level, the chip selecting signal flip-flop is further configured to output an enable level of a first chip selecting enable signal based on a transition of the first propagation clock signal from a disable level to an enable level and an enable level of a second chip selecting enable signal based on a transition of the second propagation clock signal from a disable level to an enable level; and
a clock control circuit configured to generate the first propagation clock signal and the second propagation clock signal based on a clock signal, and selectively output one of the first propagation clock signal and the second propagation clock signal based on an enable level of the first chip selecting enable signal and an enable level of the second chip selecting enable signal.

2. The semiconductor device of claim 1, wherein the clock control circuit comprises:
a clock buffer configured to generate a first internal clock signal and a second internal clock signal, in response to the clock signal;
a clock gating circuit configured to delay the first internal clock signal and output the first propagation clock signal when a first gear down control signal is at an enable level, and delay the second internal clock signal and output the second propagation clock signal when a second gear down control signal is at the enable level; and
a clock synchronizing circuit configured to generate the second gear down control signal based on the second chip selecting enable signal transitioning to the enable level, and generate the first gear down control signal based on the first chip selecting enable signal transitioning to the enable level.

3. The semiconductor device of claim 2, wherein the clock gating circuit comprises:
a first clock selector circuit configured to generate the first propagation clock signal in response to performing a first NAND operation on the first internal clock signal and the first gear down control signal and delaying a signal generated by the first NAND operation;
a second clock selector circuit configured to generate the second propagation clock signal in response to performing a second NAND operation on the second internal clock signal and the second gear down control signal and delaying a signal generated by the second NAND operation.

4. The semiconductor device of claim 2, wherein the clock synchronizing circuit comprises:
a synchronization signal generator circuit configured to generate a synchronization signal by performing an AND operation on at least the first gear down control signal and the second gear down control signal;
a first chip selecting signal gating circuit configured to perform a NAND operation on the synchronization signal and the first chip selecting enable signal;
a first signal delaying circuit configured to delay output of the first chip selecting signal gating circuit to output it as a delayed first chip selecting enable signal;
a second chip selecting signal gating circuit configured to perform a NAND operation on the synchronization signal and the second chip selecting enable signal;
a second signal delaying circuit configured to delay output of the second chip selecting signal gating part to output it as a delayed second chip selecting enable signal;
a first flip-flop configured to output a signal corresponding to a level of the delayed second chip selecting enable signal as the second gear down control signal at a rising edge of the delayed first chip selecting enable signal; and
a second flip-flop configured to output a signal corresponding to a level of the delayed first chip selecting enable signal as the first gear down control signal at a rising edge of the delayed second chip selecting enable signal.

5. The semiconductor device of claim 2, further comprising:
a command address buffer configured to sample a command address signal to output a command, at rising edges of the first internal clock signal and the second internal clock signal; and
a command decoder configured to generate a control signal based on the command when one of the first chip selecting enable signal and the second chip selecting enable signal transitions to an enable level.

6. The semiconductor device of claim 5, wherein the command decoder generates a gear down enable signal at an enable level as the control signal; and wherein the clock synchronizing circuit outputs the first gear down control signal or the second gear down control signal when the gear down enable signal is at an enable level.

7. The semiconductor device of claim 2, further comprising:
a command address buffer configured to sample a command address signal to output a command, at rising edges of the first propagation clock signal and the second propagation clock signal; and
a command decoder configured to generate a control signal based on the command when one of the first chip selecting enable signal and the second chip selecting enable signal transitions to an enable level.

8. The semiconductor device of claim 1, wherein the chip selecting signal is maintained at an enable level for two periods of the clock signal; and wherein the chip selecting signal flip-flop receives the first propagation clock signal or the second propagation clock signal, and outputs the first chip selecting enable signal or the second chip selecting enable signal at rising edges of the first propagation clock signal or the second propagation clock signal while the chip selecting signal is maintained at an enable level.

9. The semiconductor device of claim 1, wherein the chip selecting signal is maintained at an enable level for one period of the clock signal; and wherein the chip selecting signal flip-flop receives the first propagation clock signal and the second propagation clock signal, and outputs the first chip selecting enable signal or the second chip selecting enable signal at a rising edge of the first propagation clock signal or a rising edge of the second propagation clock signal while the chip selecting signal is maintained at an enable level.

10. A memory device, comprising:
a memory cell array;
an address command input circuit configured to generate a first chip selecting enable signal by latching a chip selecting signal in-sync with a first propagation clock signal, generate a second chip selecting enable signal by latching the chip selecting signal in-sync with a second propagation clock signal, output a rising edge of a first chip selecting enable signal based on a rising edge of the first propagation clock signal and a rising edge of a second chip selecting enable signal based on a rising edge of the second propagation clock signal during a period which the chip selecting signal maintains an enable level, and receive a command/address signal and output a command associated with the command/address signal;
a clock control circuit configured to divide a clock signal to generate the first propagation clock signal and the second propagation clock signal, and selectively output the first propagation clock signal or the second propagation clock signal according to a sequential order of the rising edge of the first chip selecting enable signal and the rising edge of the second chip selecting enable signal; and
a command decoder configured to generate a control signal, and control the memory cell array by decoding the command at a rising edge of the first chip selecting enable signal or a rising edge of the second chip selecting enable signal.

11. The memory device of claim 10,
wherein the clock control circuit is configured to output the second propagation clock signal when the rising edge of the first chip selecting enable signal is earlier than the rising edge of the second chip selecting enable signal, and output the first propagation clock signal when the rising edge of the second chip selecting enable signal is earlier than the rising edge of the first chip selecting enable signal.

12. The memory device of claim 10, wherein the rising edge of the first chip selecting enable signal and the rising edge of the second chip selecting enable signal sequentially occur.

13. The memory device of claim 10, wherein a period during which the chip selecting signal is at an enable level is two periods of the clock signal.

14. The memory device of claim 10, wherein the command/address signal is valid when the chip selecting signal is at an enable level.

15. The memory device of claim 10,
wherein the command decoder receives the command indicating a CS gear down mode, and outputs a control signal for switching to the CS gear down mode; and
wherein the clock control circuit receives the control signal for switching to the CS gear down mode, and selectively outputs one of the first propagation clock signal or the second propagation clock signal according to an order of a rising edge of the first chip selecting enable signal and a rising edge of the second chip selecting enable signal.

16. A memory system, comprising:
a memory controller configured to output a command/address signal, a clock signal, and a chip selecting signal; and
a memory device configured to:
generate a first propagation clock signal and a second propagation clock signal having opposite phases, based on the clock signal,
output a rising edge of a first chip selecting enable signal based on a rising edge of the first propagation clock signal and a rising edge of a second chip selecting enable signal based on a rising edge of the second propagation clock signal during a period which the chip selecting signal maintains an enable level,
enter a gear down mode according to the command/address signal, and
latch the chip selecting signal in the gear down mode according to an order of the rising edge of the first chip selecting enable signal latching the chip selecting signal in-sync with the first propagation clock signal, and the rising edge of the second chip selecting enable signal latching the chip selecting signal in-sync with the second propagation clock signal.

17. The memory system of claim 16, wherein the memory device is configured to decode a command of the command/address signal at the rising edge of the first chip selecting enable signal or the rising edge of the second chip selecting enable signal in the gear down mode.

18. The memory system of claim 16, wherein the memory device is configured to receive the command/address signal, and selectively output one of the first propagation clock signal and the second propagation clock signal according to an order of the rising edge of the first chip selecting enable signal and the rising edge of the second chip selecting enable signal after a predetermined period has elapsed.

19. The memory system of claim 16, wherein the memory controller is configured to output the chip selecting signal having an enable level during one period or two periods of the clock signal.

20. The memory system of claim 16, wherein the memory controller is configured to output the chip selecting signal having an enable level during the two periods of the clock signal in the gear down mode.

* * * * *